United States Patent
Blersch et al.

(12)

(10) Patent No.: US 6,316,747 B1
(45) Date of Patent: Nov. 13, 2001

(54) APPARATUS FOR THE THERMAL TREATMENT OF SUBSTRATES

(75) Inventors: Werner Blersch, Bussmannshausen; Heinrich Walk, Allmendingen, both of (DE)

(73) Assignee: Steag RTP Systems GmbH (DE)

( * ) Notice: Subject to any disclaimer, the term of this patent is extended or adjusted under 35 U.S.C. 154(b) by 0 days.

(21) Appl. No.: 09/623,841
(22) PCT Filed: Feb. 25, 1999
(86) PCT No.: PCT/EP99/01229
§ 371 Date: Oct. 6, 2000
§ 102(e) Date: Oct. 6, 2000
(87) PCT Pub. No.: WO99/45573
PCT Pub. Date: Sep. 10, 1999

(30) Foreign Application Priority Data

Mar. 2, 1998 (DE) .............................. 198 08 712
Feb. 8, 1999 (DE) .............................. 199 05 050

(51) Int. Cl.[7] ...................................... F27B 5/14
(52) U.S. Cl. .................. 219/390; 219/405; 219/411; 118/724; 118/50.1; 392/416
(58) Field of Search .................... 219/390, 405, 219/411; 118/724, 725, 50.1; 392/416, 418; 250/492.1, 492.2, 492.22

(56) References Cited

U.S. PATENT DOCUMENTS

| | | | | |
|---|---|---|---|---|
| 4,468,260 | * | 8/1984 | Hiramoto | 148/1.5 |
| 4,550,245 | * | 10/1985 | Arai et al. | 219/405 |
| 5,154,512 | * | 10/1992 | Schietinger et al. | 374/9 |
| 5,156,820 | * | 10/1992 | Wong et al. | 422/186.05 |
| 5,861,609 | * | 1/1999 | Kaltenbrunner et al. | 219/390 |
| 5,863,843 | * | 1/1999 | Green et al. | 438/771 |
| 5,889,258 | * | 3/1999 | Lubomirski et al. | 219/405 |
| 5,906,533 | * | 5/1999 | Harris et al. | 451/41 |
| 6,200,634 | * | 3/2001 | Johnsgard et al. | 427/248.1 |

* cited by examiner

Primary Examiner—Teresa Walberg
Assistant Examiner—Shawntina T. Fuqua
(74) Attorney, Agent, or Firm—Robert W. Becker & Associates; Robert W. Becker

(57) ABSTRACT

An apparatus for the thermal treatment of substrates is provided. The apparatus includes a reaction chamber, at least one elongated heat source, and at least one reflection wall that is disposed adjacent to the heat source and serves to reflect at least a portion of the radiation given off thereby. The reflection wall has at least one rib, and the heat source is disposed at an oblique angle to the longitudinal direction of the rib.

11 Claims, 3 Drawing Sheets

APPARATUS FOR THE THERMAL TREATMENT OF SUBSTRATES

BACKGROUND OF THE INVENTION

The present invention relates to an apparatus for the thermal treatment of substrates, and includes a reaction chamber, at least one elongated heat source, and at least one reflection wall having at least one rib for reflecting at least a portion of the radiation given off by the heat source.

An apparatus of this type is known, for example, from JP 5-190558 A. The reflection walls have grooves that extend parallel to the heating lamps and in which the heating lamps are at least partially disposed and which form the at least one rib. With this type of reflection wall, a reflected radiation results that is parallel to the lamps. Such devices with contours in a reflection wall that extend parallel to the heating lamps are furthermore known from JP 61-125021 A, as well as JP 60-193343 A.

An apparatus for the thermal treatment of substrates is disclosed in the not prepublished DE 197 37 802 that belongs to the applicant of the present application. With this apparatus, a reaction chamber of quartz glass is disposed within a second, larger chamber having reflection walls. Disposed above and below the reaction chamber are heating sources in the form of rod lamps in order to heat up a substrate, especially a semiconductor wafer, that is disposed in the reaction chamber. The reflection walls of the apparatus are flat, so that again a reflected radiation parallel to the lamps results. Due to this parallel reflection at the reflection wall there results within the reaction chamber a certain, periodic intensity distribution of the incident light for heating the substrate. In so doing, parts of the substrate can be heated more than other parts, which, however, is a drawback since the substrate must be heated as uniformly as possible.

It is therefore an object of the invention to provide an apparatus for the thermal treatment of substrates of the aforementioned general type, according to which a uniform heating of the substrates is possible.

SUMMARY OF THE INVENTION

This objective of the invention is realized in that the heating source or sources are disposed at an angle to the longitudinal direction of the at least one rib. As a result of this arrangement, the reflective image of the heating sources is rotated by an amount that depends upon the angle between the tubes and the ribs, so that a more uniformly directed distribution of the radiation intensity in the reaction chamber results.

Pursuant to one preferred specific embodiment of the invention, the reflection wall has a plurality of ribs that are disposed parallel to one another. Due to this plurality of ribs, there results a simple possibility of distributing the radiation intensity more uniformly within the entire reaction chamber. In this connection, the ribs are preferably formed by grooves.

Pursuant to a particularly preferred specific embodiment of the invention, the heating sources are rod lamps that provide a simple heating source that is simple to control.

The angle between the ribs and the heating sources is preferably 45° so that the reflected image of the heating sources is rotated in an angle of 90°. There thus results a reflection radiation that extends perpendicular to the direct radiation of the lamp tubes, as a result of which a particularly uniform radiation intensity is produced within the reaction chamber.

Pursuant to one specific embodiment, the ribs extend uniformly over the entire reflection wall in order to produce the aforementioned effect over the entire reflection wall.

Pursuant to a further specific embodiment, the ribs extend at least over portions of the reflection wall, especially in the outer regions of the reflection wall, in order to enable a reflection of the thermal radiation in the direction of the substrate that is to be heated.

Pursuant to a particularly advantageous specific embodiment of the invention, at least one turning mechanism is furthermore provided for rotating the reflection wall that has at least one rib. Due to the rotation, it is possible to adapt the intensity distribution of the radiation field in a treatment chamber to the respective process conditions. In particular, due to the rotation of the reflection wall the intensity distribution can be homogenized over time, thereby enabling a more uniform heating of the substrate. Furthermore, due to the rotation of the reflection wall the intensity distribution of the radiation is modulated with the rotational frequency of the reflection wall. A modulation can, for example, also be advantageously utilized for measuring the temperature via pyrometry.

A control unit is advantageously provided for controlling the turning mechanism in order to adapt the rotation, and hence the intensity distribution of the radiation within a treatment chamber, to the respective process conditions and process steps.

The term substrate in the present context includes semiconductor wafers, masks, plates, and all objects which, or the surface of which, is to be subjected to a thermal treatment.

BRIEF DESCRIPTION OF THE DRAWINGS

The invention will subsequently be explained with the aid of one preferred specific embodiment with reference to the drawings, in which.

DESCRIPTION OF PREFERRED EMBODIMENTS

Figure 1:
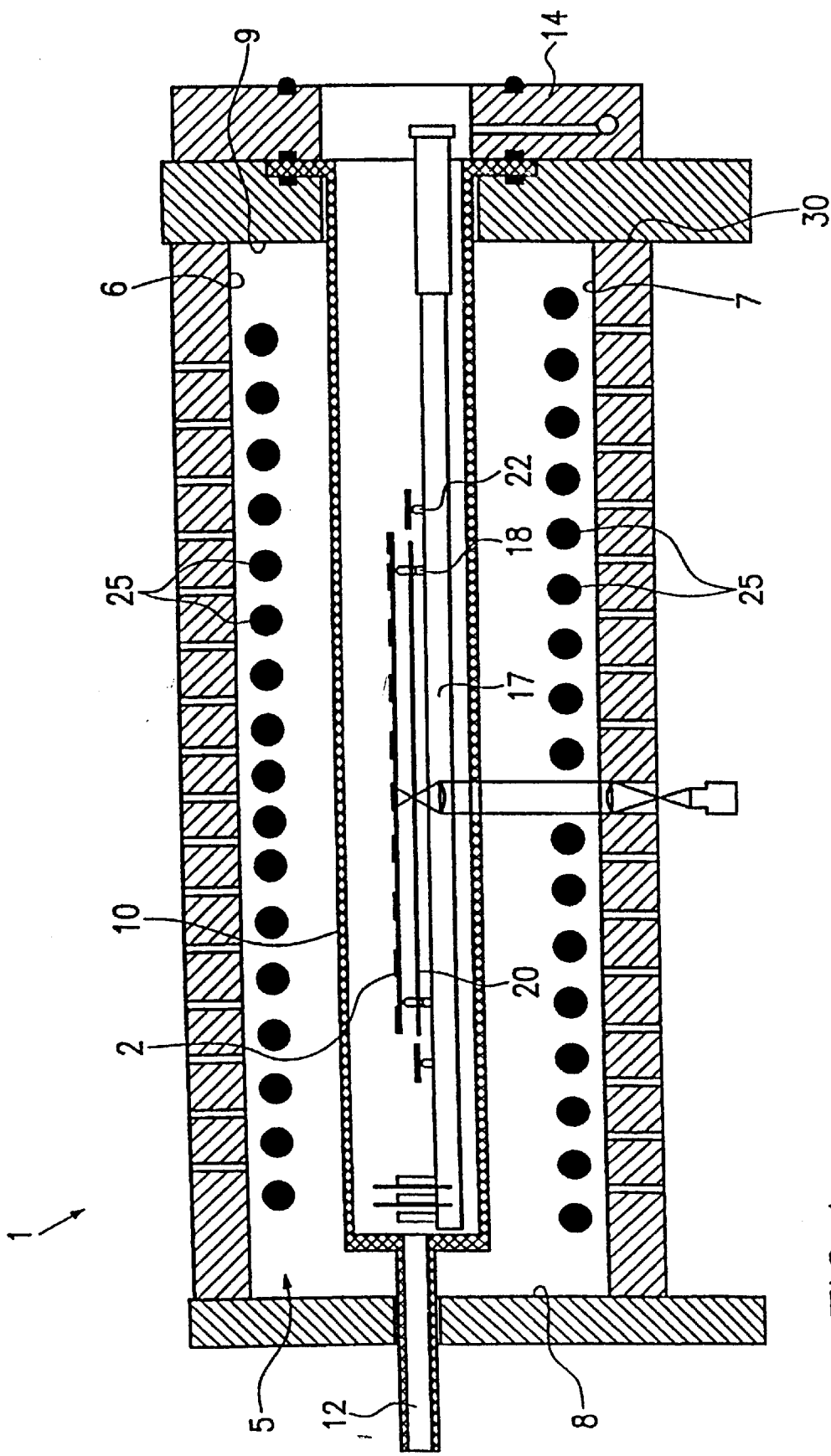
FIG. 1 shows a schematic cross-sectional illustration of an apparatus for the thermal treatment of substrates.

FIG. 1 schematically shows an apparatus 1 for the thermal treatment of substrates 2. The apparatus 1 has a first, reflective chamber 5 having an upper reflector or reflection wall 6, a lower reflector or reflection wall 7, reflecting side walls 8, 9 and non-illustrated front and rear, reflective walls. Disposed in the chamber 5 is a reaction chamber 10, which is preferably made of quartz glass. The reaction chamber 10 is provided with a gas supply conduit 12 for the introduction of a reaction gas, and a chamber door frame 14 for the introduction and removal of the substrate 2, in the present case a semiconductor wafer. The substrate 2 is disposed upon a quartz substrate holder 17 and is spaced therefrom by spacers 18. Provided concentrically relative to the substrate 2 is a compensation ring 22 with which a better thermal homogeneity can be achieved.

Disposed between the reflection walls 6, 7 and the reaction chamber are respective rod lamps 25 that extend between the non-illustrated front and rear walls in a parallel orientation relative to the side walls 8, 9. The construction of such an apparatus, as well as details relative to the functioning thereof, are described in the aforementioned DE-A44 37 361 and in the not prepublished DE-A-197 37 802, both of which belong to the applicant of the present application. In order to avoid repetition, reference is hereby made to the content of these documents to the extent relevant to the subject matter of the present application.

Figure 2:
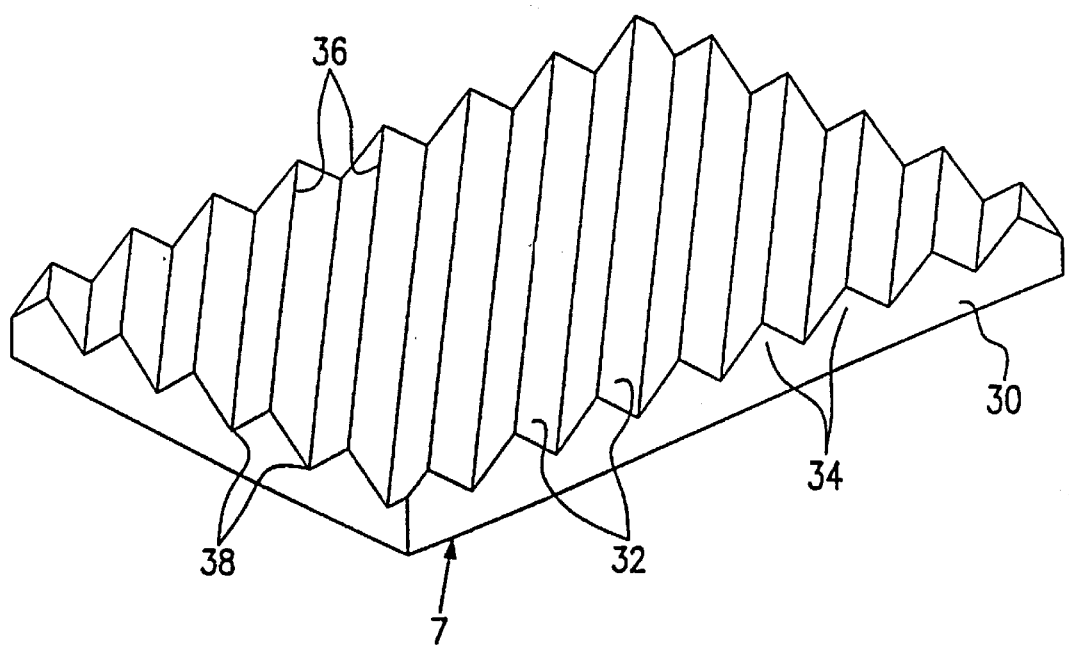
FIG. 2 shows a perspective view of an inventive reflection wall of the apparatus of FIG. 1.

Whereas in FIG. 1 the contour of the reflection walls 6 and 7 cannot be recognized, FIG. 2 shows one example for the inventive contour of a reflection wall, whereby the contour will be explained only with the aid of the lower reflection wall 7. Formed on that surface of reflection wall 7 that faces the reaction chamber 10 are grooves 32 that extend at an angle of 45° relative to a side face 30. The grooves 32 have a triangular shape such that ribs 34 are formed that have a ridge 26 that tapers to a point at the top. A lower groove edge 38 is respectively formed in the deepest point of the grooves 32 between the side faces of the triangular grooves 32 that taper upwardly to a point.

Figure 3:
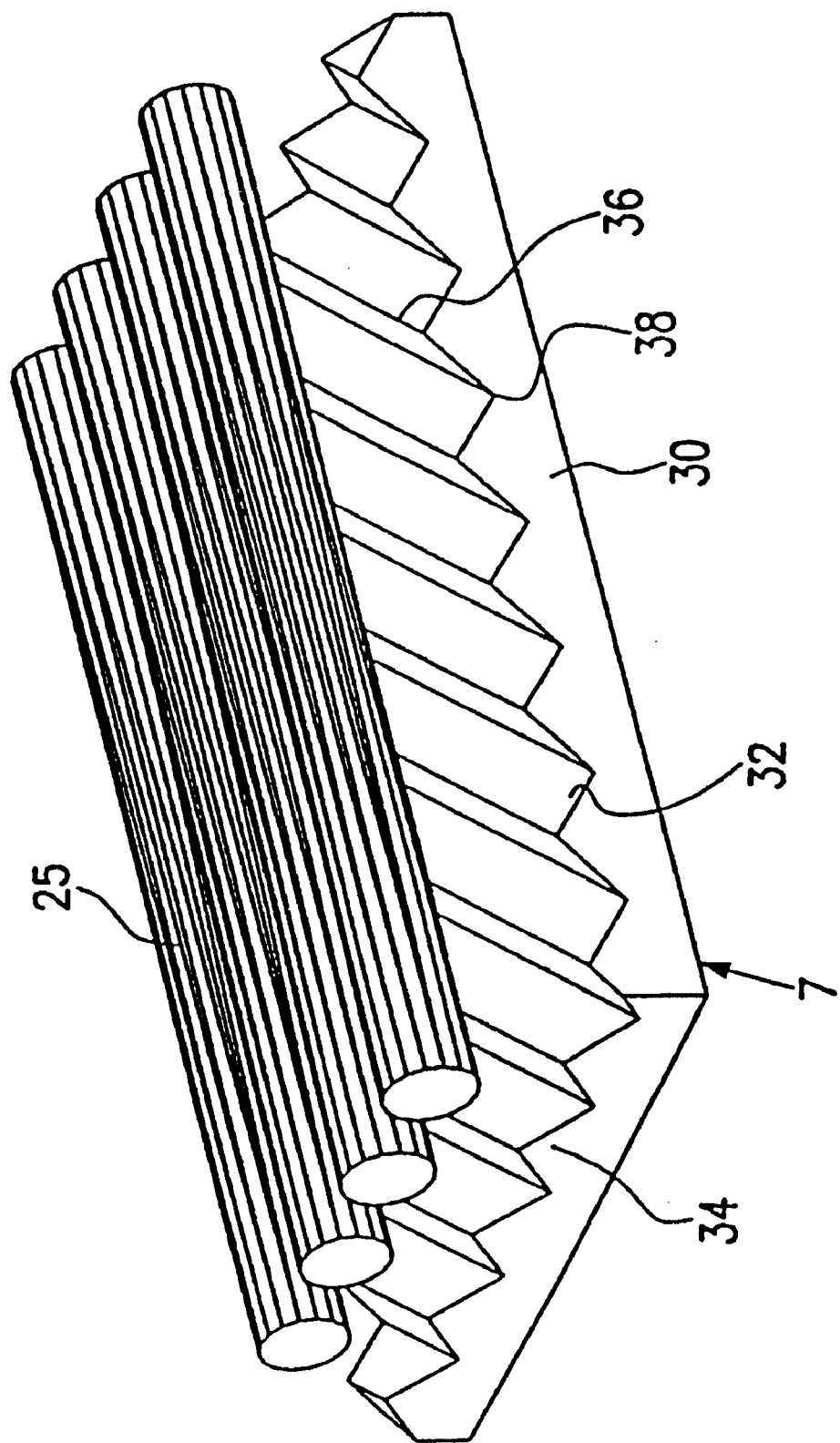
FIG. 3 shows a perspective view of the inventive reflection wall illustrated in FIG. 2 with rod lamps disposed there above.

As can be seen in FIG. 3, the rod lamps 25 extend above the reflector or reflection wall 7, and in particular parallel to the side face 30, so that the ribs 34 extend at an angle of 45° to the rod lamps 25. As a result of this arrangement, as mentioned above, a reflected image of the rod lamps 25 in an angle turned by 90° relative to the rod lamps 25 is produced.

Provided above the upper reflection wall 6 is a non-illustrated turning mechanism that communicates with the reflection wall in order to rotate the latter about an axis that extends perpendicular to the substrate 2. The rotation is effected in a controllable manner by means of an appropriate control apparatus, and is adapted to the respective process conditions and process steps during the thermal treatment of a substrate.

Furthermore, due to the rotation of the reflection wall, the intensity distribution in the chamber is modulated with the rotational frequency of the reflection wall. This modulation can be utilized accompanied by a temperature measurement via pyrometry. One method for measuring the substrate temperature via active modulation of the lamp radiation is, for example, described in the not prepublished DE-198 55 683.7, which belongs to the applicant of the present application.

The invention was previously explained with the aid of one preferred specific embodiment. However, to one having skill in the art embodiments and modifications are possible without thereby deviating from the inventive concept. In particular, other contours of the inventive reflection wall other than the illustrated ribs 34 are also possible. It is also not necessary that the contour extend uniformly over the entire reflection wall, and regions can also be provided on the reflection wall where no contour is provided.

Furthermore, the construction of the apparatus 1 need not be limited to that described. For example, it is possible to shift the rod lamps that are arranged above and below the reaction chamber by 90°, or to select the angle between the ribs 34 and the rod lamps 25 to be greater or less than 45°. In addition, it is possible to provide a movement device, especially a rotational device, in order to move the substrate within the reaction chamber.

The specification incorporates by reference the disclosure of German priority documents P 198 08 712.8 of Mar. 2, 1988, P 199 05 050.3 of Feb. 8, 1999 and German Patent Application priority document PCT/EP99/01229 of Feb. 25, 1999.

The present invention is, of course, in no way restricted to the specification disclosure of the specification and drawings, but also encompasses any modifications within the scope of the appended claims.

What we claim is:

1. An apparatus for the thermal treatment of substrates comprising:

a reaction chamber;

at least one elongated heat source; and at least one reflection wall that is disposed adjacent to said at least one heat source and serves to reflect at least a portion of radiation given off by said at least one heat source, wherein said at least one reflection wall has at least one rib, and wherein said at least one heat source is disposed at an oblique angle to a longitudinal direction of said at least one rib.

2. An apparatus according to claim 1, which includes a plurality of ribs that are disposed parallel to one another on said at least one reflection wall.

3. An apparatus according to claim 1, wherein said at least one rib is formed by grooves in said at least one reflection wall.

4. An apparatus according to claim 1, wherein said at least one heat source is at least one rod lamp.

5. An apparatus according to claim 1, wherein said oblique angle is 45°.

6. An apparatus according to claim 1, wherein said at least one rib extends uniformly over the entire at least one reflection wall.

7. An apparatus according to claim 1, wherein said at least one rib extends over at least a portion of said at least one reflection wall.

8. An apparatus according to claim 7, wherein said at least one rib extends in outer regions of said at least one reflection wall.

9. An apparatus according to claim 1, which includes a device for moving, especially rotating, a substrate that is to be heated in a radiation range of said at least one reflection wall.

10. An apparatus according to claim 1, which includes a turning mechanism for rotating said at least one reflection wall that has at least one rib.

11. An apparatus according to claim 1, which includes a control unit for controlling said turning mechanism.

* * * * *